United States Patent
Liu et al.

(10) Patent No.: US 9,734,784 B2
(45) Date of Patent: Aug. 15, 2017

(54) VOLTAGE OUTPUT DEVICE, GATE DRIVING CIRCUIT AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Baoyu Liu, Beijing (CN); Zhihua Sun, Beijing (CN); Seungmin Lee, Beijing (CN); Honglin Zhang, Beijing (CN); Weichao Ma, Beijing (CN); Jianming Wang, Beijing (CN); Shulin Yao, Beijing (CN); Xu Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/136,206

(22) Filed: Apr. 22, 2016

(65) Prior Publication Data
US 2016/0358569 A1 Dec. 8, 2016

(30) Foreign Application Priority Data
Jun. 2, 2015 (CN) .......................... 2015 1 0295725

(51) Int. Cl.
*G09G 3/36* (2006.01)
*G05F 3/16* (2006.01)
(Continued)

(52) U.S. Cl.
CPC ............. *G09G 3/3674* (2013.01); *G05F 3/16* (2013.01); *G11C 19/184* (2013.01);
(Continued)

(58) Field of Classification Search
CPC ......... G09G 3/3674; G09G 2310/0289; G09G 2310/0248; G09G 2310/0286;
(Continued)

(56) References Cited

U.S. PATENT DOCUMENTS 7,050,029 B2 * 5/2006 Liang .................. G09G 3/3622
345/209
2006/0109225 A1 * 5/2006 Haga ..................... G09G 3/3648
345/92
(Continued)

FOREIGN PATENT DOCUMENTS

| CN | 1755757 A | 4/2006 |
|----|-----------|--------|
| CN | 1833269 A | 9/2006 |

(Continued)

OTHER PUBLICATIONS

1st Office Action issued in corresponding Chinese application No. 201510295725.2 dated Oct. 8, 2016.

*Primary Examiner* — Andrew Sasinowski
(74) *Attorney, Agent, or Firm* — Nath, Goldberg & Meyer; Joshua B. Goldberg

(57) ABSTRACT

The present invention provides a voltage output device, which comprises a direct-current power supply, a reference level input terminal, a predetermined level output terminal, a voltage regulation module and a control signal generation module, the control signal generation module comprises a control signal generation unit, the voltage regulation module comprises a plurality of storage capacitors, wherein the control signal generation unit can send a charging control signal to the voltage regulation module in a charging stage of the voltage output device, and send an operation control signal to the voltage regulation module in an operating stage of the voltage output device. The present invention further provides a gate driving circuit and a display apparatus. With the voltage output device provided by the present invention,
(Continued)

a high-level voltage that is high enough and/or a low-level voltage that is low enough can be outputted, thereby satisfying specific application requirements.

13 Claims, 2 Drawing Sheets

(51) Int. Cl.
  *G11C 19/28* (2006.01)
  *G11C 19/18* (2006.01)
(52) U.S. Cl.
  CPC ........... *G09G 2300/0852* (2013.01); *G09G 2300/0871* (2013.01); *G09G 2310/0248* (2013.01); *G09G 2310/0286* (2013.01); *G09G 2310/0289* (2013.01); *G09G 2330/026* (2013.01)
(58) Field of Classification Search
  CPC ..... G09G 2330/026; G09G 2300/0871; G09G 2300/0852; G11C 19/184; G05F 3/16
  See application file for complete search history.

(56) References Cited

U.S. PATENT DOCUMENTS

| | | | |
|---|---|---|---|
| 2006/0186932 A1* | 8/2006 | Lin | G09G 3/3688 327/108 |
| 2006/0208989 A1* | 9/2006 | Kuo | G09G 3/3696 345/98 |
| 2007/0171169 A1 | 7/2007 | Hirama | |
| 2009/0039947 A1* | 2/2009 | Williams | H02M 3/07 327/536 |
| 2009/0201283 A1* | 8/2009 | Inokuchi | G09G 3/3688 345/212 |
| 2010/0134087 A1* | 6/2010 | Hwang | G05F 3/16 323/313 |
| 2010/0181985 A1* | 7/2010 | Inoue | G05F 1/56 323/311 |

FOREIGN PATENT DOCUMENTS

| | | |
|---|---|---|
| CN | 101320149 A | 12/2008 |
| JP | 2007271971 A | 10/2007 |

* cited by examiner

VOLTAGE OUTPUT DEVICE, GATE DRIVING CIRCUIT AND DISPLAY APPARATUS

FIELD OF THE INVENTION

The present invention relates to the field of electronic devices, in particular to a voltage output device, a gate driving circuit including the voltage output device and a display apparatus including the gate driving circuit.

BACKGROUND OF THE INVENTION

In order to drive a display panel to display, gate lines of the display panel need to be sequentially scanned so as to turn on thin film transistors whose gates are connected to the respective gate lines. For a thin film transistor of any type, it is turned on when its gate voltage is within a turn-on voltage range thereof, and is turned off when its gate voltage is within a turn-off voltage range thereof.

Taking a P-type thin film transistor in a liquid crystal display apparatus as an example, a turn-on voltage of the P-type thin film transistor is in the range of about 12V to about 35V, and a turn-off voltage of the P-type thin film transistor is in the range of about −6V to about −15V. The turn-on voltage and the turn-off voltage are provided by a shift register connected to the gate lines, and the shift register unit is connected to an external power supply proving the foregoing voltages. However, an external voltage generally ranges from 2.5V to 3.3V, which is far from meeting the requirement of turning on and turning off a TFT.

Therefore, how to ensure voltages supplied to gate lines being capable of turning on or turning off thin film transistors becomes a technical problem to be solved urgently in the art.

SUMMARY OF THE INVENTION

An object of the present invention is to provide a voltage output device, a gate driving circuit including the voltage output device and a display apparatus including the gate driving circuit. The voltage output device can output a voltage having a relatively high level.

To achieve the above object, as one aspect of the present invention, there is provided a voltage output device including a direct-current power supply, wherein the voltage output device further includes a reference level input terminal, a predetermined level output terminal, a voltage regulation module and a control signal generation module, the control signal generation module includes a control signal generation unit, and the voltage regulation module includes a plurality of storage capacitors, wherein the control signal generation unit is capable of sending a charging control signal to the voltage regulation module in a charging stage of the voltage output device, so as to connect a first terminal of each storage capacitor in the voltage regulation module to the direct-current power supply, and connect a second terminal of each storage capacitor to the reference level input terminal, and the control signal generation unit is capable of sending an operation control signal to the voltage regulation module in an operating stage of the voltage output device, so as to connect a plurality of storage capacitors of the voltage regulation module in series to form a first capacitor set, a first terminal of the first capacitor set is selectively connected to the reference level input terminal or the direct-current power supply, and a second terminal of the first capacitor set is selectively connected to the predetermined level output terminal.

Preferably, the operating stage includes a first boosting phase and a first voltage-inversing phase, the operation control signal includes a first boosting control signal and a first voltage-inversing control signal, and the predetermined level output terminal includes a high-level output terminal and a low-level output terminal, wherein, in the first boosting phase, the control signal generation unit sends the first boosting control signal to the voltage regulation module, where the first boosting control signal enables the first terminal of the first capacitor set to be connected to the direct-current power supply and enables the second terminal of the first capacitor set to be connected to the high-level output terminal; and in the first voltage-inversing phase, the control signal generation unit sends the first voltage-inversing control signal to the voltage regulation module, where the first voltage-inversing control signal enables the first terminal of the first capacitor set to be connected to the reference level input terminal and enables the second terminal of the first capacitor set to be connected to the low-level output terminal.

Preferably, the operating stage further includes a second boosting phase, the operation control signal includes a second boosting control signal, and, in the second boosting phase, the control signal generation unit sends the second boosting control signal to the voltage regulation module, where the second boosting control signal enables a first terminal of one storage capacitor to be connected to the direct-current power supply and enables a second terminal of the said one storage capacitor to be connected to the high-level output terminal; and/or the operating stage further includes a second voltage-inversing phase, the operation control signal includes a second voltage-inversing control signal, and, in the second voltage-inversing phase, the control signal generation unit sends the second voltage-inversing control signal to the voltage regulation module, where the second voltage-inversing control signal enables a first terminal of one storage capacitor to be connected to the reference level input terminal and enables a second terminal of the said one storage capacitor to be connected to the low-level output terminal.

Preferably, the voltage regulation module includes two storage capacitors.

Preferably, the voltage regulation module includes a plurality of charging switch units, each storage capacitor corresponds to one of the charging switch units, the charging switch unit includes a first charging switch element, which is connected between the first terminal of the storage capacitor and the direct-current power supply, and a second charging switch element, which is connected between the second terminal of the storage capacitor and the reference level input terminal, and in the charging stage, the charging control signal is capable of controlling both the first charging switch element and the second charging switch element to be turned off.

Preferably, the first charging switch element and the second charging switch element are both thin film transistors, the control signal generation module further includes a first control signal line connected to the control signal generation unit, a first electrode of the first charging switch element is connected to the direct-current power supply, a second electrode of the first charging switch element is connected to the first terminal of the corresponding storage capacitor, a first electrode of the second charging switch element is connected to the second terminal of the corresponding storage capacitor, the second electrode of the second charging switch element is connected to the reference level input terminal, and gates of the first and second charging switch elements are both connected to the first control signal line so as to transfer the charging control signal to the gates of the first charging switch element and the second charging switch element.

Preferably, the predetermined level output terminal includes a high-level output terminal and a low-level output terminal, the operating stage includes a first boosting phase, the operation control signal includes a first boosting control signal, the voltage regulation module includes a plurality of boosting series connection switch elements, one boosting series connection switch element is serially connected between every two adjacent storage capacitors, one boosting series connection switch element is serially connected between the first terminal of one of the two adjacent storage capacitors and the direct-current power supply, one boosting series connection switch element is provided between the second terminal of the other storage capacitor and the high-level output terminal, and in the first boosting phase, the first boosting control signal is capable of controlling the plurality of boosting series connection switch elements to be turned on.

Preferably, the boosting series connection switch elements are thin film transistors, the control signal generation module further includes a second control signal line connected to the control signal generation unit, where gates of the plurality of boosting series connection switch elements are all connected to the second control signal line, and for each boosting series connection switch element connected between two adjacent storage capacitors, a first terminal of the boosting series connection switch element is connected to the first terminal of one storage capacitor, and a second terminal of the boosting series connection switch element is connected to the second terminal of the other storage capacitor, so as to transfer the first boosting control signal to the gates of the boosting series connection switch elements.

Preferably, the operating stage includes a first voltage-inversing phase and a second voltage-inversing phase, the operation control signal includes a first voltage-inversing control signal and a second voltage-inversing control signal, the voltage regulation module further includes a first voltage-inversing series connection switch element, a plurality of second voltage-inversing series connection switch elements and a third voltage-inversing series connection switch element, the first voltage-inversing series connection switch element is connected to the reference level input terminal, and the third voltage-inversing series connection switch element is connected in series between the low-level output terminal and one storage capacitor;

one of the plurality of second voltage-inversing series connection switch elements is connected in series between the first voltage-inversing series connection switch element and the storage capacitor connected in series to the third voltage-inversing series connection switch element;

each of the remaining second voltage-inversing series connection switch elements is connected in series between adjacent storage capacitors;

in the first voltage-inversing phase, the first voltage-inversing control signal is capable of controlling each second voltage-inversing series connection switch element connected in series between adjacent storage capacitors, the first voltage-inversing series connection switch element and the third voltage-inversing series connection switch element to be turned on; and in the second voltage-inversing phase, the second voltage-inversing control signal is capable of controlling the second voltage-inversing series connection switch element, which is connected in series between the first voltage-inversing series connection switch element and the storage capacitor connected in series to the third voltage-inversing series connection switch element, the first voltage-inversing series connection switch element and the third voltage-inversing series connection switch element to be turned on.

Preferably, the control signal generation module includes a third control signal line and a fourth control signal line both connected to the control signal generation unit, the first voltage-inversing series connection switch element, the second voltage-inversing series connection switch elements and the third voltage-inversing series connection switch element are all thin film transistors, gates of the first voltage-inversing series connection switch element and the third voltage-inversing series connection switch element are both connected to the third control signal line and the fourth control signal line at the same time, a gate of the second voltage-inversing series connection switch element connected in series between the first voltage-inversing series connection switch element and the storage capacitor connected in series with the third voltage-inversing series connection switch element is connected to the third control signal line, gates of the remaining second voltage-inversing series connection switch elements are connected to the fourth control signal line, the third control signal line is used for transferring the second voltage-inversing control signal, and the fourth control signal line is used for transferring the first voltage-inversing control signal.

As another aspect of the present invention, there is provided a gate driving circuit which includes a shift register and a voltage output device, the shift register including multiple stages of shift register units, and each shift register unit including a high-level input terminal and a low-level input terminal, wherein the voltage output device is the above voltage output device provided by the present invention, when the predetermined level output terminal is used for outputting a high-level voltage, the high-level input terminal of the shift register unit is connected to the predetermined level output terminal, and when the predetermined level output terminal is used for outputting a low-level voltage, the low-level input terminal is connected to the predetermined level output terminal.

Preferably, the predetermined level output terminal includes the high-level output terminal and the low-level output terminal, the high-level input terminal of the shift register unit is connected to the high-level output terminal, and the low-level input terminal of the shift register unit is connected to the low-level output terminal.

As still another aspect of the present invention, there is provided a display apparatus, which includes a gate driving circuit, wherein the gate driving circuit is the above gate driving circuit provided by the present invention.

BRIEF DESCRIPTION OF THE DRAWINGS

The accompanying drawings, which constitute a part of the specification, are used for providing further understanding of the present invention, and for explaining the present invention together with the following specific implementations, but are not intended to limit the present invention. In the accompanying drawings.

REFERENCE NUMERALS

100: voltage regulation module; 200: direct-current power supply; 300: control signal generation module; S1: first voltage-inversing series switch element; S2, S3: first charging switch element; S4, S5, S7: boosting series switch element; S6, S11: second voltage-inversing series switch element; S10: third voltage-inversing series switch element; C1, C2: storage capacitor

DESCRIPTION OF THE PREFERRED EMBODIMENT

Specific implementations of the present invention will be described in detail below in conjunction with the accompanying drawings. It should be understood that the specific implementations described herein are merely used for describing and explaining the present invention, rather than limiting the present invention.

Figure 1:
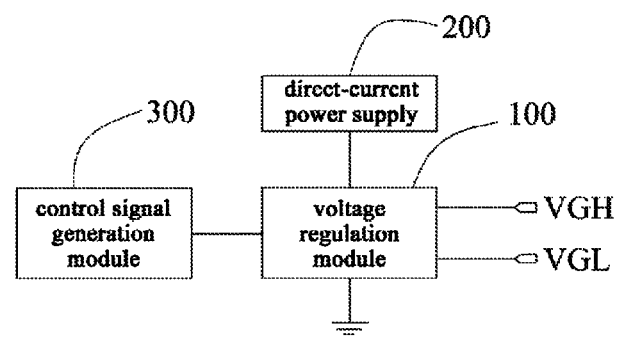
FIG. 1 is a schematic block diagram of a voltage output device provided by the present invention.

As shown in FIG. 1, the present invention provides a voltage output device, which includes a direct-current power supply 200, wherein the voltage output device further includes a reference level input terminal, a predetermined level output terminal, a voltage regulation module 100 and a control signal generation module 200.

The control signal generation module 300 includes a control signal generation unit, and the voltage regulation module 100 includes a plurality of storage capacitors.

The control signal generation unit is capable of sending a charging control signal to the voltage regulation module 100 during a charging stage of the voltage output device, so as to enable a first terminal of each storage capacitor in the voltage regulation module 100 to be connected to the direct-current power supply 200, and to enable a second terminal of each storage capacitor to be connected to the reference level input terminal.

The control signal generation unit is capable of sending an operation control signal to the voltage regulation module 100 during an operating stage of the voltage output device, so as to enable a plurality of storage capacitors of the voltage regulation module 100 to be connected in series to form a first capacitor set a first terminal of which is selectively connected to the reference level input terminal or the direct-current power supply 200, and a second terminal of which is connected to the predetermined level output terminal.

In the present invention, there is no particular requirement on a level of a signal applied to the reference level input terminal, and generally, the signal applied to the reference level input terminal has a voltage lower than that of a voltage signal outputted by the direct-current power supply 200.

Preferably, the signal applied to the reference level input terminal is at 0V, i.e., the reference level input terminal is grounded.

As described above, in the charging stage, the first terminal of each storage capacitor in the voltage regulation module 100 is connected to the direct-current power supply 200, and the second terminal of each storage capacitor in the voltage regulation module 100 is connected to the reference level input terminal. After the charging stage is finished, a voltage difference across two terminals of each storage capacitor is a difference between the output voltage of the direct-current power supply 200 and the voltage provided by the reference level input terminal. In a case where the reference level input terminal is grounded, each storage capacitor stores the output voltage of the direct-current power supply 200.

After the charging stage is finished, the voltage output device may be controlled to enter into an operating stage, and in this stage, a predetermined level can be outputted from the predetermined level output terminal. As described above, during the operating stage of the voltage output device, a plurality of storage capacitors are connected in series to form the first capacitor set. It should be noted that, the plurality of storage capacitors refers to two or more storage capacitors. That is to say, the first capacitor may include all or a part of the storage capacitors.

As described above, the first terminal of the first capacitor set is selectively connected to the reference level input terminal or the direct-current power supply, which means that the first terminal of the first capacitor set may be connected to either the reference level input terminal or the direct-current power supply 200, but cannot be connected to both the reference level input terminal and the direct-current power supply 200 at the same time. In a case where the first capacitor set includes N storage capacitors, the voltage stored in the first capacitor set is N times the voltage outputted by the direct-current power supply 200. In a case where the first terminal of the first capacitor set is connected to the direct-current power supply 200, and the second terminal thereof is connected to the predetermined level output terminal, the predetermined level output terminal outputs a high-level voltage of N×VR, where VR is the voltage outputted by the direct-current power supply 200. In a case where the first terminal of the first capacitor set is connected to the reference level input terminal, the predetermined level output terminal outputs a level of −(N×VR)−Vref, where Vref is the voltage provided by the reference level input terminal. In the case where the reference level input terminal is grounded, the predetermined level output terminal outputs a level of −(N×VR).

It can be known that, a high-level voltage at a sufficiently high level or a low-level voltage at a sufficiently low level can be outputted by using the voltage output device provided by the present invention, thereby satisfying specific application requirements.

For example, when the voltage output device provided by the present invention is used in a display apparatus, a high-level voltage at a sufficiently high level or a low-level voltage at a sufficiently low level can be outputted, so that the thin film transistors in the display apparatus can be turned on or turned off reliably, which facilities stable display of images.

In the present invention, the voltage output device may output a high-level voltage at a sufficiently high level only, or output a low-level voltage at a sufficiently low level only, or output a high-level voltage at a sufficiently high level and a low-level voltage at a sufficiently low level during different phases, respectively.

In order that a high-level voltage at a sufficiently high level and a low-level voltage at a sufficiently low level can be respectively outputted at different phases, preferably, the operating stage includes a first boosting phase and a first voltage-inversing phase, the operation control signal includes a first boosting control signal and a first voltage-inversing control signal, and the predetermined level output terminal includes a high-level output terminal VGH and a low-level output terminal VGL. In the implementation shown in FIG. 1, like the predetermined level output terminal in the preferable implementation, the predetermined level output terminal includes the high-level output terminal VGH and the low-level output terminal VGL.

Specifically, in the first boosting phase, the control signal generation unit sends the first boosting control signal to the voltage regulation module 100, the first boosting control signal enables the first terminal of the first capacitor set to be connected to the direct-current power supply 200, and enables the second terminal of the first capacitor set to be connected to the high-level output terminal VGH. In the first boosting phase, the high-level output terminal VGH can output a high-level voltage of N×VR. It can be easily understood that the first boosting control signal enables N storage capacitors to be connected in series to form the first capacitor set.

Specifically, in the first voltage-inversing phase, the control signal generation unit can send the first voltage-inversing control signal to the voltage regulation module, where the first voltage-inversing control signal enables the first terminal of the first capacitor set to be connected to the reference level input terminal, and enables the second terminal of the first capacitor set to be connected to the low-level output terminal VGL. In the first voltage-inversing phase, the low-level output terminal VGL can output a low-level voltage of −(N×VR)−Vref. It can be easily understood that, the first voltage-inversing control signal enables N storage capacitors to be connected in series to form the first capacitor set. As described above, in the case where the reference level input terminal is grounded, the low-level output terminal VGL can output a low-level voltage of −(N×VR).

It can be known from the above description that, in the voltage output device provided by the present invention, both a high-level voltage at a sufficiently high level and a low-level voltage at a sufficiently low level can be outputted by using the same capacitor set, so that the voltage output device provided by the present invention can satisfy different operation conditions, and thus the structure of an apparatus including the voltage output device is simplified and the cost thereof is lowered.

In order that the voltage output device provided by the present invention can be applied in more situations, preferably, the operating stage further includes a second boosting phase, the operation control signal further includes a second boosting control signal, and, during the second boosting phase, the control signal generation unit sends the second boosting control signal to the voltage regulation module 100, where the second boosting control signal enables a first terminal of one storage capacitor to be connected to the direct-current power supply 200, and enables a second terminal of the storage capacitor to be connected to the high-level output terminal VGH. In the second boosting phase, the high-level output terminal can output a high-level signal of VR.

Similarly, the operating stage may further include a second voltage-inversing phase, and the operation control signal may further include a second voltage-inversing control signal. During the second voltage-inversing phase, the control signal generation unit sends the second voltage-inversing control signal to the voltage regulation module 100, where the second boosting control signal enables a first terminal of one storage capacitor to be connected to the reference level input terminal, and enables a second terminal of the said one storage capacitor to be connected to the low-level output terminal VGL. In the second voltage-inversing phase, the low-level output terminal VGL can output a low-level signal of −VR−Vref.

In the present invention, the number of the storage capacitors in the voltage regulation module 100 is not specifically limited, and may be set according to a specific application situation of the voltage output device. For example, in a preferable implementation of the present invention, the number of the storage capacitors is two, and the first capacitor set is formed by connecting the two storage capacitors in series.

Figure 2:
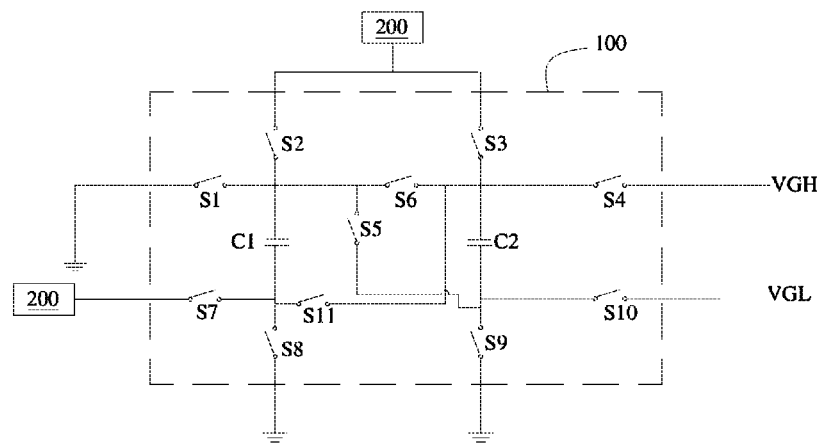
FIG. 2 is a schematic circuit diagram of a voltage output device provided by the present invention.

As shown in FIG. 2, the voltage regulation module 100 includes storage capacitors C1 and C2. The first capacitor set is formed by connecting the two storage capacitors C1 and C2 in series. In the implementation shown in FIG. 2, the reference level input terminal is grounded.

Figure 3:
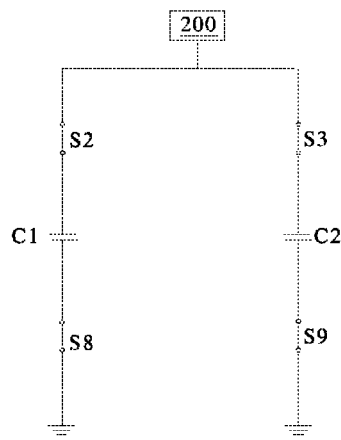
FIG. 3 is an equivalent circuit diagram of the voltage output device provided in FIG. 2 during a charging stage.

As shown in FIG. 3, during the charging stage, the storage capacitors C1 and C2 are connected in parallel and both charged by the direct-current power supply 200, and after the charging stage is finished, voltages stored in the storage capacitors C1 and C2 are both the voltage VR outputted by the direct-current power supply 200.

Figure 4:
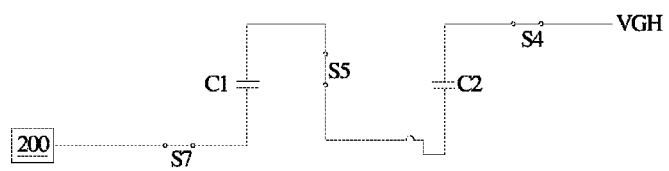
FIG. 4 is an equivalent circuit diagram of the voltage output device provided in FIG. 2 during a first boosting phase in which a high-level signal of 2VR is outputted.

As shown in FIG. 4, during the first boosting phase, the storage capacitors C1 and C2 form the first capacitor set, the first terminal of the first capacitor set is connected to the direct-current power supply 200, and the high-level output terminal VGH can output a high level of 2VR.

Figure 5:
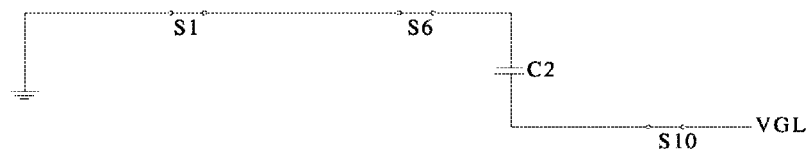
FIG. 5 is an equivalent circuit diagram of the voltage output device provided in FIG. 2 during a second voltage-inversing phase in which a low-level signal of −VR is outputted.

As shown in FIG. 5, during the second voltage-inversing phase, one terminal of the storage capacitor C2 is connected to the reference level input terminal, the other terminal thereof is connected to the low-level output terminal VGL, and the low-level output terminal VGL can output a low level of −VR.

Figure 6:
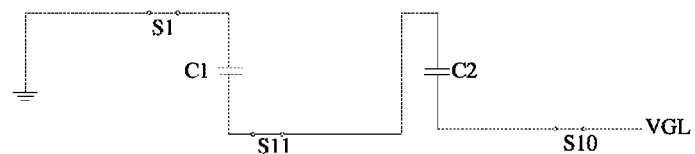
FIG. 6 is an equivalent circuit diagram of the voltage output device provided in FIG. 2 during a first voltage-inversing phase in which a low-level signal of −2VR is outputted.

As shown in FIG. 6, during the first voltage-inversing phase, the storage capacitors C1 and C2 are connected in series to form the first capacitor set, one terminal of the first capacitor set is connected to the reference level input terminal, and the other terminal thereof is connected to the low-level output terminal, which can output a low level of −2VR.

In order to realize parallel connection between a plurality of storage capacitors during the charging stage, as a specific implementation of the present invention, preferably, the voltage regulation module 100 includes a plurality of charging switch units, each storage capacitor corresponds to one of the charging switch units, the charging switch unit includes a first charging switch element, which is connected between the first terminal of the storage capacitor and the direct-current power supply, and a second charging switch element, which is connected between the second terminal of the storage capacitor and the reference level input terminal, and in the charging stage, the charging control signal is capable of controlling both the first charging switch element and the second charging switch element to be closed.

In the specific implementation shown in FIG. 2, the voltage regulation module 100 includes the first charging switch elements S2 and S3, and the second charging switch elements S8 and S9, wherein the first charging switch element S2 and the second charging switch element S8 correspond to the storage capacitor C1, and the first charging switch element S3 and the second charging switch element S9 correspond to the storage capacitor C2.

In the charging stage, the first charging switch elements S2 and S3 and the second charging switch elements S8 and S9 are all turned on, so that the storage capacitors C1 and C2 are connected in parallel and are both in a charging state. The storage capacitors C1 and C2 store the voltage VR outputted by the direct-current power supply 200 when fully charged.

It can be easily understood that, in any other stage than the charging stage, the charging switch elements are turned off, so as to prevent the plurality of storage capacitors from being connected in parallel.

In the present invention, there is no particular requirement on the specific structure of the charging switch element, as long as the charging switch element can be turned on in the charging stage. For convenience of control, as a referable implementation of the present invention, both the first charging switch element and the second charging switch element are thin film transistors, the control signal generation module may further include a first control signal line connected to the control signal generation unit, a first terminal of the first charging switch element is connected to the direct-current power supply, a second terminal of the first charging switch element is connected to the first terminal of the corresponding storage capacitor, a first electrode of the second charging switch element is connected to the second terminal of the corresponding storage capacitor, the second electrode of the second charging switch element is connected to the reference level input terminal, and gates of the first and second charging switch elements are both connected to the first control signal line to transfer the charging control signal to the gates of the first and second charging switch elements.

In the charging stage, a charging control signal may be provided to the first control signal line by an external driving chip to control the first and second charging switch elements to be turned on. In any other stage than the charging stage, a cut-off voltage may be provided to the first control signal line by the external driving chip to control the first and second charging switch elements to be turned off.

As described above, the predetermined level output terminal includes the high-level output terminal VGH and the low-level output terminal VGL, and accordingly, the operating stage may include a first boosting phase, and the operation control signal may include a first boosting control signal. In order that the plurality of storage capacitors are connected in series to form the first capacitor set in the first boosting phase and the first capacitor set is connected in series between the direct-current power supply and the high-level output terminal VGH, preferably, the voltage regulation module 100 may include a plurality of boosting series connection switch elements, one boosting series connection switch element is serially connected between every two adjacent storage capacitors, one boosting series connection switch element is provided between the first terminal of one storage capacitor and the direct-current power supply, one boosting series connection switch element is provided between the second terminal of another storage capacitor and the high-level output terminal, and during the first boosting phase, the first boosting control signal is capable of controlling the plurality of boosting series connection switch elements to be turned on.

In the present invention, the expression "one boosting series connection switch element is serially connected between two adjacent storage capacitors" means that one terminal of the boosting series connection switch element is connected to the second terminal of one of the two adjacent storage capacitors and the other terminal of the boosting series connection switch element is connected to the first terminal of the other storage capacitor. When the boosting series connection switch element is turned on, the second terminal of one storage capacitor is electrically connected to the first terminal of the other storage capacitor, so as to form a series connection.

In the implementation shown in FIG. 2, the voltage regulation module 100 includes the boosting series connection switch elements S4, S5 and S7. Specifically, the boosting series connection switch element S5 is connected in series between the storage capacitors C1 and C2, the boosting series connection switch element S7 is connected in series between the direct-current power supply 200 and the storage capacitor C1, and the boosting series connection switch element S4 is connected in series between the high-level output terminal VGH and the storage capacitor C2. In the first boosting phase, the boosting series connection switch elements S4, S5 and S7 are all turned on, so that the storage capacitors C1 and C2 are connected in series to form the first capacitor set, and the formed first capacitor set is serially connected to the direct-current power supply 200, which ensures that the high-level output terminal VGH can output a high-level voltage of 2VR. In any other phase than the first boosting phase, the boosting series connection switch elements are turned off, so as to prevent the direct-current power supply 200 from being serially connected to the first capacitor set and prevent the high-level output terminal VGH from being serially connected to the first capacitor set in the meanwhile.

In the present invention, the specific structures of the boosting series connection switch elements are not particularly limited. As an implementation of the present invention, the boosting series connection switch elements may be thin film transistors, the control signal generation module may further include a second control signal line connected to the control signal generation unit, where gates of the plurality of boosting series connection switch elements are all connected to the second control signal line, and for each boosting series connection switch element connected between adjacent storage capacitors, a first terminal of the boosting series connection switch element is connected to the first terminal of one storage capacitor, and a second terminal of the boosting series connection switch element is connected to the second terminal of the other storage capacitor, so as to transfer the first boosting control signal to the gates of the boosting series connection switch elements.

In the first boosting phase, the first boosting control signal is provided to the second control signal line by the control signal generation unit to control the boosting series connection switch elements to be turned on. In any other phase other than the first boosting phase, a cut-off voltage is provided to the second control signal line by the control signal generation unit to control the boosting series connection switch elements to be turned off.

As described above, the operating stage may further include a first voltage-inversing phase and a second voltage-inversing phase, and accordingly, the operation control signal may further include a first voltage-inversing control signal and a second voltage-inversing control signal. In order that the first capacitor set formed by connecting the storage capacitors in series is connected between the reference level input terminal and the low-level output terminal VGL in the first voltage-inversing phase and that one storage capacitor is connected in series between the reference level input terminal and the low-level output terminal VGL in the second voltage-inversing phase, preferably, the voltage regulation module 100 may further include a first voltage-inversing series connection switch element S1, a plurality of second voltage-inversing series connection switch elements and a third voltage-inversing series connection switch element S10, the first voltage-inversing series connection switch element S1 is connected to the reference level input terminal, the third voltage-inversing series connection switch element S10 is connected in series between the low-level output terminal and one storage capacitor.

One of the plurality of second voltage-inversing series connection switch elements is connected in series between the first voltage-inversing series connection switch element S1 and the storage capacitor connected in series to the third voltage-inversing series connection switch element S10. In the second voltage-inversing phase, the second voltage-inversing control signal is capable of controlling the second voltage-inversing series connection switch element between the first voltage-inversing series connection switch element S1 and the third voltage-inversing series connection switch element S10 to be turned on, and when the second voltage-inversing series connection switch element between the first voltage-inversing series connection switch element S1 and the third voltage-inversing series connection switch element S10 is turned on, there is only one storage capacitor in the formed equivalent circuit, where one terminal of the storage capacitor is connected to the reference level input terminal and the other terminal thereof is connected to the low-level output terminal, and therefore, the storage capacitor can discharge, and the low-level output terminal thus outputs a low-level voltage of −VR.

Except the said one second voltage-inversing series connection switch element, the remaining voltage-inversing series connection switch element(s) are each connected in series between adjacent storage capacitors. In the first voltage-inversing phase, the first voltage-inversing control signal is capable of controlling each second voltage-inversing series connection switch element, which is connected in series between the first voltage-inversing series connection switch element and the storage capacitor connected in series to the third voltage-inversing series connection switch element, the first voltage-inversing series connection switch element and the third voltage-inversing series connection switch element to be turned on. When each second voltage-inversing series connection switch element connected in series between adjacent storage capacitors is turned on, the plurality of storage capacitors are connected in series to form the first capacitor set, one terminal of the first capacitor set is connected to the reference level input terminal, and the other terminal of the first capacitor set is connected to the low-level output terminal, so that a low-level voltage having an absolute value equal to an integer multiple of the voltage outputted by the direct-current power supply is outputted.

In the implementation shown in FIG. 2, the voltage regulation module 100 includes the first voltage-inversing series connection switch element S1, the second voltage-inversing series connection switch elements S6 and S11, and the third voltage-inversing series connection switch element S10.

To output a low-level voltage of −VR, the first voltage-inversing series connection switch element S1, the second voltage-inversing series connection switch element S6 and the third voltage-inversing series connection switch element S10 may be turned on, so that the storage capacitor C2 is connected in series between the reference level input terminal and the low-level output terminal VGL, the storage capacitor C2 discharges, and the low-level output terminal can output a low-level voltage of −VR.

To output a low-level voltage of −2VR, the first voltage-inversing series connection switch element S1, the second voltage-inversing series connection switch element S11 and the third voltage-inversing series connection switch element S10 may be turned on, so that the storage capacitors C1 and C2 are connected in series to form the first capacitor set, and the first capacitor set is connected in series between the reference level input terminal and the low-level output terminal VGL, so as to output a low-level voltage of −2VR.

In the present invention, there is no particular requirement on the specific structures of the first, second and third voltage-inversing series connection switch elements. For example, the first, second and third voltage-inversing series connection switch elements may all be thin film transistors.

To realize control of the above voltage-inversing series connection switch elements, the control signal generation module may further include a third control signal line and a fourth control signal line, the first, second and third voltage-inversing series connection switch elements are all thin film transistors, gates of the first voltage-inversing series connection switch element and the third voltage-inversing series connection switch element are both connected to the third control signal line and the fourth control signal line at the same time, a gate of the second voltage-inversing series connection switch element, which is connected in series between the first voltage-inversing series connection switch element and the storage capacitor connected in series with the third voltage-inversing series connection switch element, is connected to the third control signal line, and gate(s) of the remaining second voltage-inversing series connection switch element(s) is(are) connected to the fourth control signal line, where the third control signal line is used to transfer the second voltage-inversing control signal, and the fourth control signal line is used to transfer the first voltage-inversing control signal.

In the first voltage-inversing phase, the first voltage-inversing control signal is provided to the fourth control signal line by the control signal generation unit, so as to turn on the first voltage-inversing series connection switch element, each second voltage-inversing series connection switch element connected in series between adjacent storage capacitors and the third voltage-inversing series connection switch element to form the first capacitor set, which is connected in series between the reference level input terminal and the low-level output terminal, so that the low-level output terminal outputs a low-level voltage having an absolute value equal to an integer multiple of the voltage outputted by the direct-current power supply. In any other phase than the first voltage-inversing phase, a turned-off voltage is provided to the third control line to turn off the second voltage-inversing series connection switch element(s) connected in series between adjacent storage capacitors.

In the second voltage-inversing phase, the second voltage-inversing control signal is provided to the third control signal line by the control signal generation unit, so as to turn on the first voltage-inversing series connection switch element, the second voltage-inversing series connection switch element connected in series between the first voltage-inversing series connection switch element and the storage capacitor connected in series with the third voltage-inversing series connection switch element, and the third voltage-inversing series connection switch element, so that one storage capacitor is connected in series between the reference level input terminal and the low-level output terminal, and the low-level output terminal outputs a low-level voltage (i.e., −VR) having an absolute value equal to that of the voltage outputted by the direct-current power supply. In any other phase than the second voltage-inversing phase, a turned-off voltage is provided to the fourth control line, so as to turn off the second voltage-inversing series connection switch element which is connected in series between the first voltage-inversing series connection switch element and the storage capacitor connected in series with the third voltage-inversing series connection switch element.

As another aspect of the present invention, the present invention further provides a gate driving circuit including a shift register and a voltage output device, where the shift register includes multiple stages of cascaded shift register units, each shift register unit includes a high-level input terminal and a low-level input terminal, wherein the voltage output device is the above voltage output device provided by the present invention, when the predetermined level output terminal is used for outputting a high-level voltage, the high-level input terminal of the shift register unit is connected to the predetermined level output terminal, and when the predetermined level output terminal is used for outputting a low-level voltage, the low-level input terminal is connected to the predetermined level output terminal.

As a preferable implementation, the predetermined level output terminal includes the high-level output terminal and the low-level output terminal, the high-level input terminal is connected to the high-level output terminal, and the low-level input terminal is connected to the low-level output terminal.

The voltage output device can outputs a high positive voltage that is sufficiently high and a negative voltage that is sufficiently low, which ensures that the thin film transistors in the gate driving circuit are turned on or turned off, and also ensures that the gate driving circuit outputs a positive voltage that is sufficiently high or a low enough negative voltage that is sufficiently low, which in turn ensures that thin film transistors in a pixel circuit can be turned on or turned off.

As still another aspect of the present invention, there is provided a display apparatus including a gate driving circuit, wherein the gate driving circuit is the above gate driving circuit provided by the present invention.

It could be understood that the foregoing implementations are merely exemplary implementations for describing the principle of the present invention, but the present invention is not limited thereto. A person of ordinary skill in the art may make various modifications and improvements without departing from the spirit and essence of the present invention, and these modifications and improvements shall fall into the protection scope of the present invention.

The invention claimed is:

1. A voltage output device, comprising a direct-current power supply, wherein the voltage output device further comprises a reference level input terminal, a predetermined level output terminal, a voltage regulation module and a control signal generation module, the control signal generation module comprises a control signal generation unit, and the voltage regulation module comprises a plurality of storage capacitors, wherein the control signal generation unit is capable of sending a charging control signal to the voltage regulation module in a charging stage of the voltage output device, so as to enable a first terminal of each storage capacitor in the voltage regulation module to be connected to the direct-current power supply, and enable a second terminal of each storage capacitor to be connected to the reference level input terminal, and the control signal generation unit is capable of sending an operation control signal to the voltage regulation module in an operating stage of the voltage output device, so as to enable a plurality of storage capacitors of the voltage regulation module to be connected in series to form a first capacitor set, a first terminal of the first capacitor set is selectively connected to the reference level input terminal or the direct-current power supply, and a second terminal of the first capacitor set is selectively connected to the predetermined level output terminal.

2. The voltage output device according to claim 1, wherein the operating stage comprises a first boosting phase and a first voltage-inversing phase, the operation control signal comprises a first boosting control signal and a first voltage-inversing control signal, and the predetermined level output terminal comprises a high-level output terminal and a low-level output terminal, in the first boosting phase, the control signal generation unit sends the first boosting control signal to the voltage regulation module, the first boosting control signal enables the first terminal of the first capacitor set to be connected to the direct-current power supply, and enables the second terminal of the first capacitor set to be connected to the high-level output terminal; and in the first voltage-inversing phase, the control signal generation unit sends the first voltage-inversing control signal to the voltage regulation module, the first voltage-inversing control signal enables the first terminal of the first capacitor set to be connected to the reference level input terminal, and enables the second terminal of the first capacitor set to be connected to the low-level output terminal.

3. The voltage output device according to claim 2, wherein the operating stage further comprises a second boosting phase, the operation control signal further comprises a second boosting control signal, and in the second boosting phase, the control signal generation unit sends the second boosting control signal to the voltage regulation module, the second boosting control signal enables a first terminal of one storage capacitor to be connected to the direct-current power supply, and enables a second terminal of the said one storage capacitor to be connected to the high-level output terminal; and/or the operating stage further comprises a second voltage-inversing phase, the operation control signal further comprises a second voltage-inversing control signal, and in the second voltage-inversing phase, the control signal generation unit sends the second voltage-inversing control signal to the voltage regulation module, the second voltage-inversing control signal enables a first terminal of one storage capacitor to be connected to the reference level input terminal, and enables a second terminal of the said one storage capacitor to be connected to the low-level output terminal.

4. The voltage output device according to claim 1, wherein the voltage regulation module comprises two storage capacitors.

5. The voltage output device according to claim 1, wherein the voltage regulation module comprises a plurality of charging switch units, each storage capacitor corresponds to one of the charging switch units, the charging switch unit comprises a first charging switch element connected between the first terminal of the storage capacitor and the direct-current power supply and a second charging switch element connected between the second terminal of the storage capacitor and the reference level input terminal, and in the charging stage, the charging control signal is capable of controlling both the first charging switch element and the second charging switch element to be turned off.

6. The voltage output device according to claim 5, wherein the first charging switch element and the second charging switch element are both thin film transistors, the control signal generation module further comprises a first control signal line connected to the control signal generation unit, a first terminal of the first charging switch element is connected to the direct-current power supply, a second terminal of the first charging switch element is connected to the first terminal of the corresponding storage capacitor, a first terminal of the second charging switch element is connected to the second terminal of the corresponding storage capacitor, the second terminal of the second charging switch element is connected to the reference level input terminal, and gates of the first charging switch element and the second charging switch element are both connected to the first control signal line so as to transfer the charging control signal to the gates of the first charging switch element and the second charging switch element.

7. The voltage output device according to claim 5, wherein the predetermined level output terminal comprises a high-level output terminal and a low-level output terminal, the operating stage comprises a first boosting phase, the operation control signal comprises a first boosting control signal, the voltage regulation module comprises a plurality of boosting series connection switch elements, one boosting series connection switch element is serially connected between every two adjacent storage capacitors, one boosting series connection switch element is serially connected between the first terminal of one of the two adjacent storage capacitors and the direct-current power supply, one boosting series connection switch element is provided between the second terminal of the other of the two adjacent storage capacitors and the high-level output terminal, and in the first boosting phase, the first boosting control signal is capable of controlling the plurality of boosting series connection switch elements to be turned on.

8. The voltage output device according to claim 7, wherein the boosting series connection switch elements are thin film transistors, the control signal generation module further comprises a second control signal line connected to the control signal generation unit, gates of the plurality of boosting series connection switch elements are all connected to the second control signal line, and for each boosting series connection switch element serially connected between two adjacent storage capacitors, a first terminal of the boosting series connection switch element is connected to the first terminal of one of the two adjacent storage capacitors, and a second terminal of the boosting series connection switch element is connected to the second terminal of the other of the two adjacent storage capacitors, so as to transfer the first boosting control signal to the gates of the boosting series connection switch elements.

9. The voltage output device according to claim 7, wherein the operating stage comprises a first voltage-inversing phase and a second voltage-inversing phase, the operation control signal comprises a first voltage-inversing control signal and a second voltage-inversing control signal, the voltage regulation module further comprises a first voltage-inversing series connection switch element, a plurality of second voltage-inversing series connection switch elements, and a third voltage-inversing series connection switch element, the first voltage-inversing series connection switch element is connected to the reference level input terminal, and the third voltage-inversing series connection switch element is connected in series between the low-level output terminal and one storage capacitor;
 one of the plurality of second voltage-inversing series connection switch elements is connected in series between the first voltage-inversing series connection switch element and the storage capacitor connected in series to the third voltage-inversing series connection switch element;
 each of the remaining second voltage-inversing series connection switch elements is connected in series between adjacent storage capacitors;
 in the first voltage-inversing phase, the first voltage-inversing control signal is capable of controlling each second voltage-inversing series connection switch element connected in series between adjacent storage capacitors, the first voltage-inversing series connection switch element and the third voltage-inversing series connection switch element to be turned on; and
 in the second voltage-inversing phase, the second voltage-inversing control signal is capable of controlling the second voltage-inversing series connection switch element, which is connected in series between the first voltage-inversing series connection switch element and the storage capacitor connected in series to the third voltage-inversing series connection switch element, the first voltage-inversing series connection switch element and the third voltage-inversing series connection switch element to be turned on.

10. The voltage output device according to claim 9, wherein the control signal generation module comprises a third control signal line and a fourth control signal line both connected to the control signal generation unit, the first voltage-inversing series connection switch element, the second voltage-inversing series connection switch elements and the third voltage-inversing series connection switch element are all thin film transistors, gates of the first voltage-inversing series connection switch element and the third voltage-inversing series connection switch element are both connected to the third control signal line and the fourth control signal line at the same time, a gate of the second voltage-inversing series connection switch element connected in series between the first voltage-inversing series connection switch element and the storage capacitor connected in series with the third voltage-inversing series connection switch element is connected to the third control signal line, gates of the remaining second voltage-inversing series connection switch elements are connected to the fourth control signal line, the third control signal line is used for transferring the second voltage-inversing control signal, and the fourth control signal line is used for transferring the first voltage-inversing control signal.

11. A gate driving circuit, comprising a shift register and a voltage output device, the shift register comprising multiple stages of shift register units, and each shift register unit comprising a high-level input terminal and a low-level input terminal, wherein the voltage output device is the voltage output device according to claim 1, when the predetermined level output terminal is used for outputting a high-level voltage, the high-level input terminal of the shift register unit is connected to the predetermined level output terminal, and when the predetermined level output terminal is used for outputting a low-level voltage, the low-level input terminal is connected to the predetermined level output terminal.

12. The gate driving circuit according to claim 11, the predetermined level output terminal comprises a high-level output terminal and a low-level output terminal, the high-level input terminal of the shift register unit is connected to the high-level output terminal, and the low-level input terminal of the shift register unit is connected to the low-level output terminal.

13. A display apparatus, comprising a gate driving circuit, wherein the gate driving circuit is the gate driving circuit according to claim 11.

* * * * *